(12) United States Patent
Chang

(10) Patent No.: US 11,728,301 B2
(45) Date of Patent: Aug. 15, 2023

(54) SEMICONDUCTOR PACKAGE INCLUDING TEST PAD AND BONDING PAD STRUCTURE FOR DIE CONNECTION AND METHODS FOR FORMING THE SAME

(71) Applicant: Taiwan Semiconductor Manufacturing Company Limited, Hsinchu (TW)

(72) Inventor: Jen-Yuan Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 119 days.

(21) Appl. No.: 17/461,764

(22) Filed: Aug. 30, 2021

(65) Prior Publication Data

US 2023/0060208 A1  Mar. 2, 2023

(51) Int. Cl.
*H01L 23/58* (2006.01)
*H01L 29/10* (2006.01)
*H01L 23/00* (2006.01)
*H01L 21/66* (2006.01)
*H01L 25/065* (2023.01)

(52) U.S. Cl.
CPC ............ *H01L 24/06* (2013.01); *H01L 22/32* (2013.01); *H01L 24/03* (2013.01); *H01L 24/08* (2013.01); *H01L 24/80* (2013.01); *H01L 25/0657* (2013.01); *H01L 2224/031* (2013.01); *H01L 2224/0557* (2013.01); *H01L 2224/05624* (2013.01); *H01L 2224/05639* (2013.01); *H01L 2224/05644* (2013.01); *H01L 2224/05647* (2013.01); *H01L 2224/06505* (2013.01); *H01L 2224/06515* (2013.01); *H01L 2224/08146* (2013.01); *H01L 2224/80001* (2013.01)

(58) Field of Classification Search
CPC combination set(s) only.
See application file for complete search history.

(56) References Cited

U.S. PATENT DOCUMENTS

| | | | | |
|---|---|---|---|---|
| 11,251,157 | B2* | 2/2022 | Yang | H01L 24/08 |
| 2009/0243118 | A1* | 10/2009 | Akiba | H01L 24/03 |
| | | | | 257/773 |
| 2015/0137382 | A1* | 5/2015 | Yang | H01L 21/76898 |
| | | | | 257/774 |
| 2019/0131284 | A1* | 5/2019 | Jeng | H01L 21/563 |
| 2019/0363068 | A1* | 11/2019 | Hotta | H01L 24/80 |
| 2022/0359456 | A1* | 11/2022 | Chen | H01L 25/50 |

* cited by examiner

*Primary Examiner* — Niki H Nguyen
(74) *Attorney, Agent, or Firm* — The Marbury Law Group, PLLC

(57) ABSTRACT

A semiconductor package structure includes a first die, a second die disposed on the first die, and a bonding pad structure. The first die includes a semiconductor substrate, an interconnect structure disposed on the first semiconductor substrate, a passivation layer disposed on the interconnect structure, and a test pad disposed on the passivation layer. The test pad includes a contact region that extends through the passivation layer and electrically contacts the interconnect structure, and a bonding recess that overlaps with the contact region in a vertical direction perpendicular to a plane of the first semiconductor substrate. The bonding pad structure electrically connects the first die and the second die and directly contacts at least a portion of the bonding recess.

20 Claims, 12 Drawing Sheets

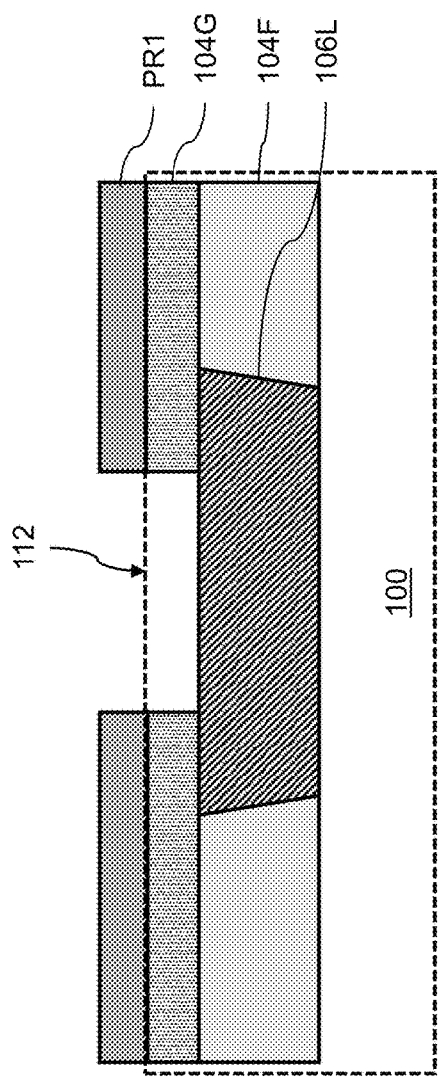
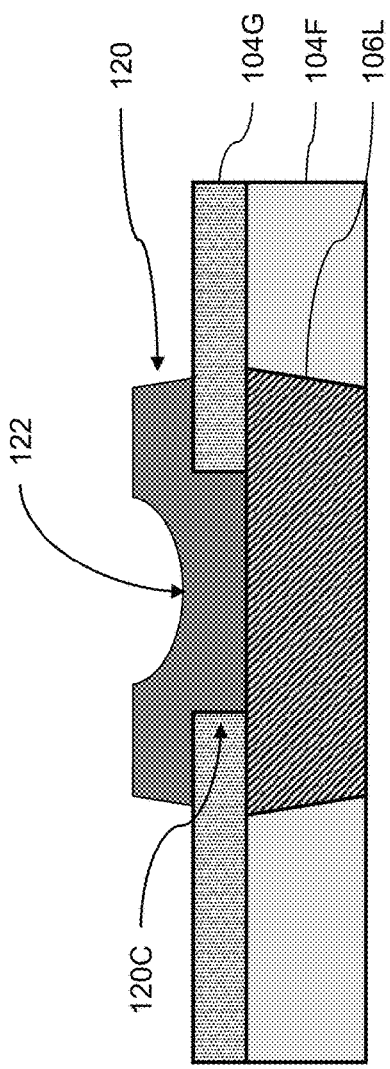

SEMICONDUCTOR PACKAGE INCLUDING TEST PAD AND BONDING PAD STRUCTURE FOR DIE CONNECTION AND METHODS FOR FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller semiconductor packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4F are cross-sectional views illustrating the steps of the method of FIG. 3.

DETAILED DESCRIPTION

Figure 1A:
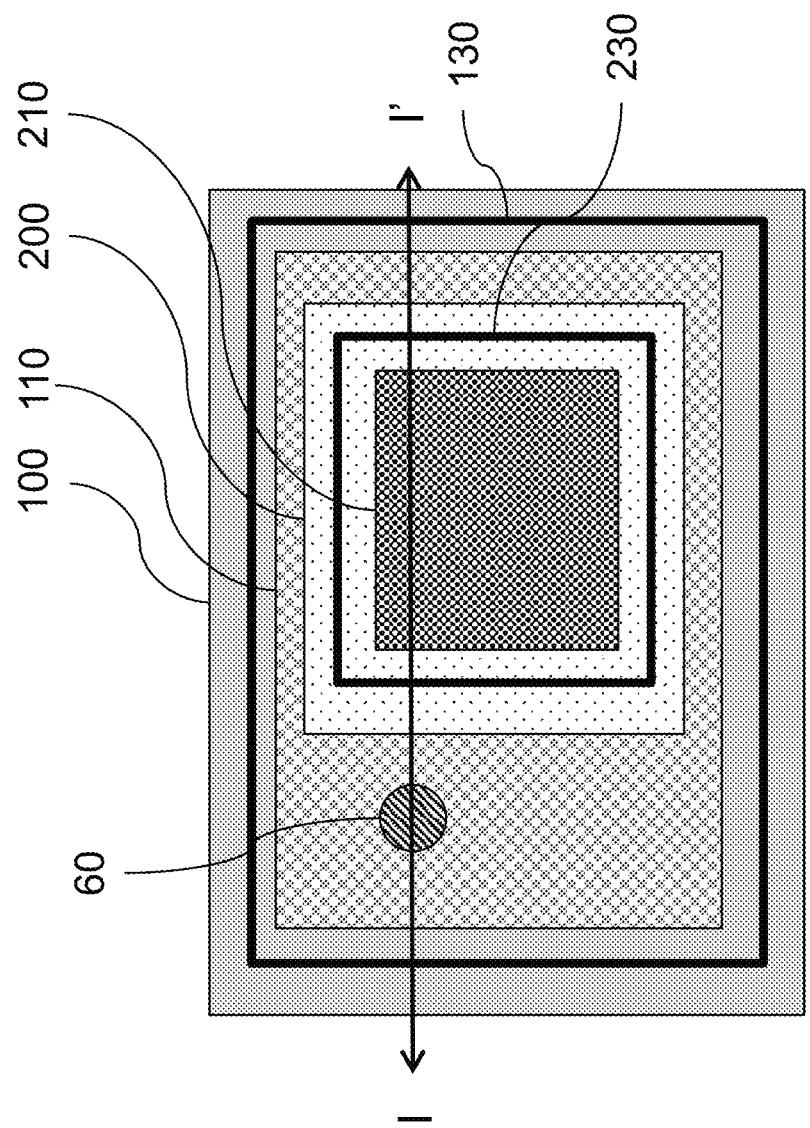
FIG. 1A is a simplified top view of a three-dimensional device structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to semiconductor packages that include test pads and die bonding structures that are configured to electrically connect stacked dies. The configuration of the test pads and die bonding structures provides low contact and circuit resistance, and improves space utilization.

Figure 1B:
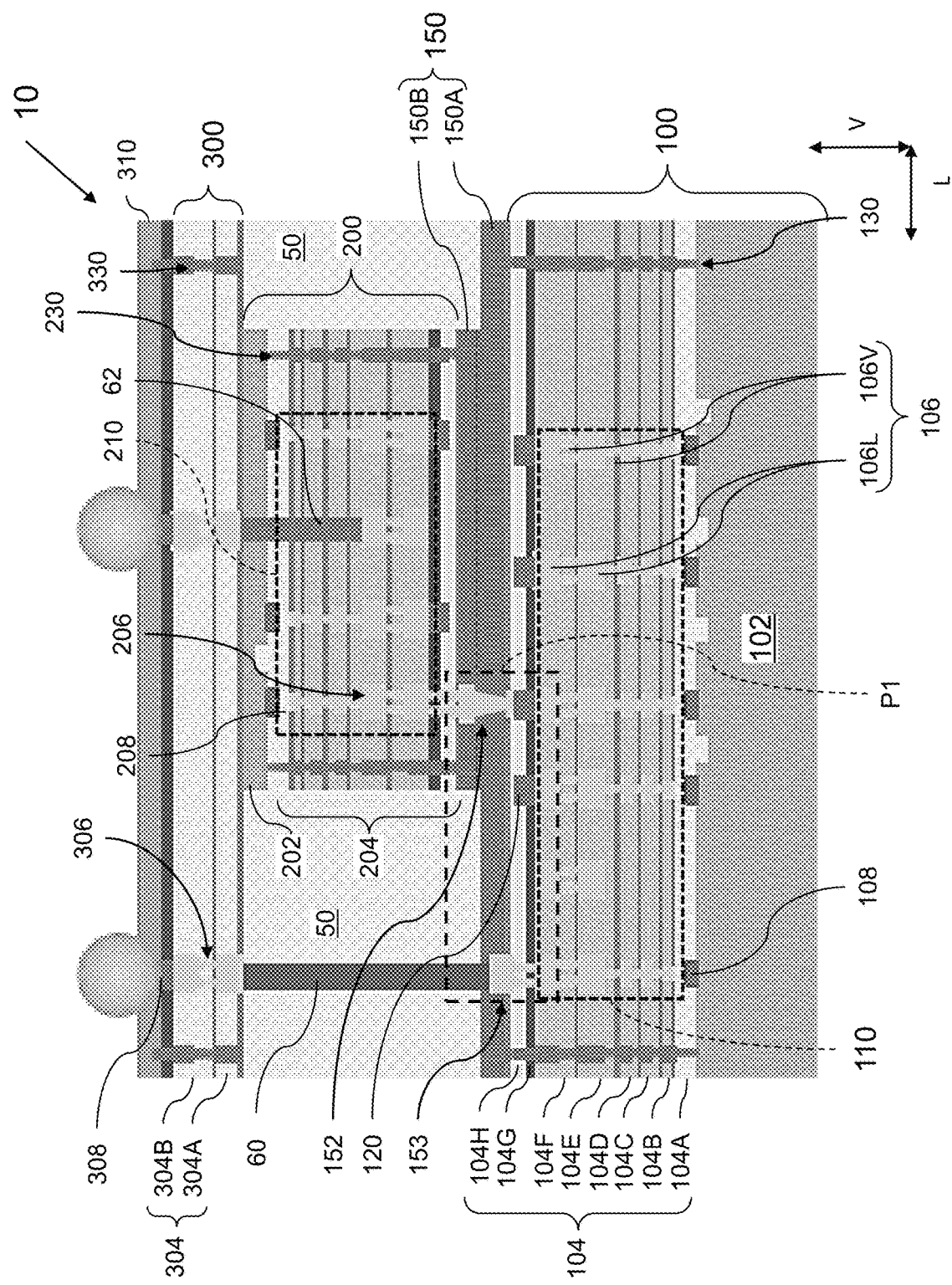
FIG. 1B is a cross-sectional view taken along line I-I' of FIG. 1A.

FIG. 1A is a simplified top view of a semiconductor package 10, according to various embodiments of the present disclosure. FIG. 1B is a cross-sectional view taken along line I-I' of FIG. 1A. FIG. 1C is an enlarged view of a portion P1 of FIG. 1B. Referring to FIGS. 1A-1C, the semiconductor package 10 includes a first die 100 and at least one second die 200 stacked thereon in a vertical direction V (e.g., a die stacking direction), which may be perpendicular to a lateral direction L.

The first die 100 may be, for example, an application-specific integrated circuit (ASIC) chip, an analog chip, a sensor chip, a wireless and radio frequency chip, a voltage regulator chip or a memory chip. In some embodiments, the first die 100 may be an active component or a passive component. In some embodiments, the first die 100 includes a first semiconductor substrate 102, a first dielectric structure 104, a first interconnect structure 110 embedded within the first dielectric structure 104, a first seal ring 130, and a die bonding structure 150.

In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device, respectively.

In some embodiments, the first semiconductor substrate 102 includes isolation structures defining at least one active area, and a first device layer may be disposed on/in the active area. The first device layer may include a variety of devices. In some embodiments, these devices may include active components, passive components, or a combination thereof. In some embodiments, these devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The first dielectric structure 104 may be disposed on a front side of the first semiconductor substrate 102. The various layers of first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

The first dielectric structure 104 may be a single layer or a multiple-layer dielectric structure. For example, as shown in FIG. 1B, the first dielectric structure 104 may include multiple dielectric layers, such as a substrate planarization layer 104A, inter-layer dielectric (ILD) layers 104B-104F, a passivation layer 104G, and an interconnect planarization layer 104H. However, the present disclosure are not limited to any particular number of dielectric layers.

In some embodiments, the ILD layers 104B-104F may be formed of a dielectric material such as silicon oxide, silicon oxynitride, silicon nitride, a low dielectric constant (low-k) material, or a combination thereof. Other suitable dielectric materials may be within the contemplated scope of disclosure.

The passivation layer 104G may be formed of formed of a passivation material, such as polyimide, silicon oxide, silicon nitride, benzocyclobutene (BCB) polymer, polyimide (PI), polybenzoxazole (PBO) combinations thereof, or the like. Other suitable passivation materials may be within the contemplated scope of disclosure. In some embodiments, the passivation layer 104G may include multiple layers of such passivation materials.

The substrate planarization layer 104A and the interconnect planarization layer 104H may be formed of formed of a material that is water resistant, resistant to stress, has a high step coverage and is uniform. For example, substrate planarization layer 104A and the interconnect planarization layer 104H may be formed of polyimides, resins, low-viscosity liquid epoxies, or spin-on glass (SOG) materials. Other suitable planarization materials may be within the contemplated scope of disclosure.

A first interconnect structure 110 may be formed in the first dielectric structure 104. The first interconnect structure 110 may include first metal features 106 disposed in the first dielectric structure 104. The first metal features 106 may be any of a variety of vias and metal lines. The first metal features 106 be formed of any suitable electrically conductive material, such as tungsten (W), copper (Cu), a copper alloy, aluminum (Al), an aluminum alloy, combinations thereof, or the like. In some embodiments, barrier layers (not shown) may be disposed between the first metal features 106 and the dielectric layers of first dielectric structure 104, to prevent the material of the first metal features 106 from migrating to the first semiconductor substrate 102. The barrier layer may include Ta, TaN, Ti, TiN, CoW, or combinations thereof, for example. Other suitable barrier layer materials may be within the contemplated scope of disclosure.

The first metal features 106 may include electrically conductive metal lines 106L and via structures 106V. The via structures 106V may operate to electrically connect the metal lines 106L disposed in adjacent dielectric layers 104B-104F. The first metal features 106 may be electrically connected to substrate pads 108 disposed on the first semiconductor substrate 102, such that the first interconnect structure 110 may electrically interconnect connect semiconductor devices formed on the first semiconductor substrate 102.

The first seal ring 130 may extend around the periphery of the first die 100. For example, the first seal ring 130 may be disposed in the first dielectric structure 104 and may laterally surround the interconnect structure 110. The first seal ring 130 may be configured to protect the interconnect structure 110 from contaminant diffusion and/or physical damage during device processing, such as plasma etching and/or deposition processes.

The first seal ring 130 may include copper at an atomic percentage greater than 80%, such as greater than 90% and/or greater than 95% although greater or lesser percentages may be used. The first seal ring 130 may include conductive lines and via structures that are connected to each other, and may be formed simultaneously with the metal lines 106L and via structures 106V of the first metal features 106 of the interconnect structure 110. The first seal ring 130 may be electrically isolated from the first metal features 106.

The first die 100 may also include test pads 120 that are covered by the planarization layer 104H. The test pads 120 may be electrically connected to the first interconnect structure 110.

In some embodiments, the first metal features 106, test pads 120, and/or the first seal ring 130 may be formed by a dual-Damascene process or by multiple single Damascene processes. Single-Damascene processes generally form and fill a single feature with copper per Damascene stage. Dual-Damascene processes generally form and fill two features with a metal (e.g., copper) at once, e.g., a trench and overlapping through-hole may both be filled with a single copper deposition using dual-Damascene processes. In alternative embodiments, the first metal features 106, test pads 120, and/or the first seal ring 130 may be may be formed by an electroplating process.

For example, the Damascene processes may include patterning the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP)

may then be performed to remove excess copper (e.g., overburden) that is disposed on top of the first dielectric structure 104.

In particular, the patterning, metal deposition, and planarizing processes may be performed for each of the dielectric layers 104A-104G, in order to form the interconnect structure 110 and/or the first seal ring 130. For example, dielectric layer 104A may be deposited and patterned to form openings. A deposition process may then be performed to fill the openings in the dielectric layer 104A. A planarization process may then be performed to remove the overburden and form first metal features 106 in the dielectric layer 104A. These process steps may be repeated to form the dielectric layers 104B-104F and the corresponding first metal features 106 and/or first seal ring 130, and thereby complete the first interconnect structure 110 and/or first seal ring 130.

The second die 200 may be disposed over and bonded to the first die 100 by a die bonding structure 150. The die bonding structure 150 may include a first bonding layer 150A disposed on the first die 100 and a second bonding layer 150B disposed on the second die 200. The die bonding structure 150 may include one or more bonding pad structures 152 configured to electrically connect the first die 100 and the second die 200.

The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of dies. In some embodiments, the second die 200 may be an active component or a passive component. In some embodiments, the second die 200 is smaller than the first die 100.

In some embodiments, the second die 200 is similar to the first die 100. For example, the second die 200 may include a second semiconductor substrate 202, a second dielectric structure 204, a second interconnect structure 210 and a second seal ring 230 embedded within the second dielectric structure 204. Thus, the difference between the second die 200 and the first die 100 is discussed in details below.

The second dielectric structure 204 may be disposed over a first side (e.g., front side) of the second semiconductor substrate 202. The second dielectric structure 204 may have a single-layer or multi-layer dielectric layer structure. For example, the second dielectric structure 204 may include multiple dielectric layers, such as a substrate planarization layer, inter-layer dielectric (ILD) layers, an interconnect planarization layer, and a passivation layer. However, the various embodiments of the present disclosure are not limited to any particular number of dielectric layers.

The second interconnect structure 210 may be formed in the second dielectric structure 204. Specifically, the second interconnect structure 210 may be overlapped with and electrically connected to an integrated circuit region of the second semiconductor substrate 202. In some embodiments, the second interconnect structure 210 includes second metal features 206. The second metal features 206 are disposed in the second dielectric structure 204 and may be electrically connected to second pads 208 disposed on the second semiconductor substrate 202, such that the second interconnect structure 210 may electrically connect semiconductor devices formed on the second semiconductor substrate 202.

The second seal ring 230 may be similar to the first seal ring 130. For example, the second seal ring 230 may include copper at an atomic percentage greater than 80%, such as greater than 90% and/or greater than 95%, although greater or lesser percentages of copper may be used. The second seal ring 230 may be disposed over the first side (e.g., front side) of the second semiconductor substrate 202. Specifically, the second seal ring 230 may surround the second interconnect structure 210, may extend through the second dielectric structure 204, and may be electrically insulated from circuit elements of the second semiconductor substrate 202. In some embodiments, the second seal ring 230 may be formed during the formation of the second dielectric structure 204. The second seal ring 230 may be at substantially the same level as the second interconnect structure 210. Specifically, the top surface of the second seal ring 230 may be coplanar with the top surfaces of the uppermost second metal features 206 of the second interconnect structure 210.

In some embodiments, the size of the second die 200 may be different from (e.g., less than) the size of the first die 100. Herein, the term "size" refers to the length, width and/or area. For example, as shown in the top view of FIG. 1A, the size (e.g., area or footprint) of the second die 200 may be less than the size of the first die 100.

During assembly, the second die 200 may be flipped (e.g., turned upside down) and mounted onto the first die 100. In particular, a second wafer including a plurality of the second dies 200 may be positioned over a first wafer including a plurality of the first dies 100. In other embodiments, the second wafer may be diced to singulate the second die(s) 200, and the second die(s) 200 may be individually placed on the first wafer, over respective first die(s) 100.

As shown in FIG. 1B, in some embodiments, the first die 100 and second die 200 may be face-to-face bonded together by bonding the first bonding layer 150A and the second bonding layer 150B.

The first bonding layer 150A may be aligned with the second bonding layer 150B and then an anneal operation may bond the bonding structures together. In some embodiments, before the second die 200 is bonded to the first die 100, the second bonding layer 150B and the first bonding layer 150A may be aligned, such that the bonding pad structure(s) 152 may be formed during the bonding process. After the alignment is achieved, the first bonding layer 150A and the second bonding layer 150B may be bonded together by a hybrid bonding process that includes metal-to-metal bonding and dielectric-to-dielectric bonding.

In some embodiments, the semiconductor package 10 may include a dielectric encapsulation (DE) layer 50, through-dielectric via (TDV) structures 60, through-substrate via (TSV) structures 62, a redistribution layer structure 300, external bonding pads 308, and a passivation layer 310. The DE layer 50 may be disposed on the die bonding structure 150, surrounding the second die 200. Specifically, the DE layer 50 may surround the sidewalls of the second die 200, expose the backside of the second die 200, and overlay the front side of the first die 100. In some embodiments, the backside of the second die 200 may be substantially co-planar with the top surface of the DE layer 50. The DE layer 50 may also surround side walls of the first die 100, in some embodiments. In various embodiments, the DE layer 50 includes a molding compound. The molding compound may include a resin and a filler. In alternative embodiments, the DE layer 50 may include silicon oxide, silicon nitride, or a combination thereof. The DE layer 50 may be formed by spin-coating, lamination, deposition or the like.

The TDV structure 60 may be formed through the DE layer 50 and electrically contact the first interconnect structure 110 and the redistribution layer structure 300. For example, the TDV structure 60 may contact electrically conductive metal features 306 of the redistribution layer structure 300 and a TDV bonding pad structure 153 of the die bonding structure 150. In some embodiments, the TDV structures 60 include an electrically conductive material, such as copper, a copper alloy, aluminum, an aluminum alloy, or a combination thereof. In some embodiments, a diffusion barrier layer (not shown) may be disposed around the TDV structures 60, to prevent metal diffusion into the DE layer 50. The diffusion barrier layer may include Ta, TaN, Ti, TiN, CoW, or a combination thereof. Other suitable barrier layer materials may be within the contemplated scope of disclosure.

The TSV structure 62 may extend through the second semiconductor substrate 202 and electrically contact respective metal features 206 of the second interconnect structure 210. The TSV structure 62 may be formed of similar materials and by similar methods as the TDV structures 60.

In some embodiments, the first die 100 and second die 200 may be face-to-back bonded. For example, the backside of the second semiconductor substrate 202 may face the front side of the first semiconductor substrate 100, and the bonding pad structure 152 may be electrically connected to the TSV structure 62.

The redistribution layer structure 300 may be disposed over the second side (e.g., back side) of the second die 200 and over the DE layer 50. The redistribution layer structure 300 may comprise a third dielectric structure 304 having a single-layer or a multi-layer structure. For example, the third dielectric structure 304 may include a first dielectric layer 304A and a second dielectric layer 304B. The redistribution layer structure 300 may include the third metal features 306 disposed therein. In some embodiments, the metal features 306 may be electrically connected to the TDV structures 60 and/or to the through-silicon via structures 62. In some embodiments, the redistribution layer structure 300 may include a photo-sensitive material such as polybenzoxazole (PBO), polyimide (PI), benzocyclobutene (BCB), a combination thereof, or the like. In some embodiments, the metal features 306 may include copper, nickel, titanium, a combination thereof, or the like. Other suitable conductive metal materials and/or photo-sensitive materials may be within the contemplated scope of disclosure to form the metal features 306.

The redistribution layer structure 300 may include a third seal ring 330. The third seal ring 330 may surround the metal features 306. The third seal ring 330 may include materials and structures similar to that of the first seal ring 130 and/or the second seal ring 230.

The external bonding pads 308 may be disposed over the redistribution layer structure 300. In some embodiments, the external bonding pads 308 may be under bump metallization (UBM) pads for mounting conductive connectors, such as metal pillars, .mu.-bumps or the like. The external bonding pads 308 may include a metal or a metal alloy. The external bonding pads 308 may include aluminum, copper, nickel, an alloy thereof, or the like, for example. Other suitable pad materials may be within the contemplated scope of disclosure.

The passivation layer 310 may cover the redistribution layer structure 300 and edge portions of the external bonding pads 308. Upper surfaces of the external bonding pads 308 may be exposed through the passivation layer 310. In some embodiments, the passivation layer 310 includes silicon oxide, silicon nitride, benzocyclobutene (BCB) polymer, polyimide (PI), polybenzoxazole (PBO), a combination thereof, or the like. Other suitable passivation layer materials may be within the contemplated scope of disclosure.

Die Bonding Features

Figure 2A:
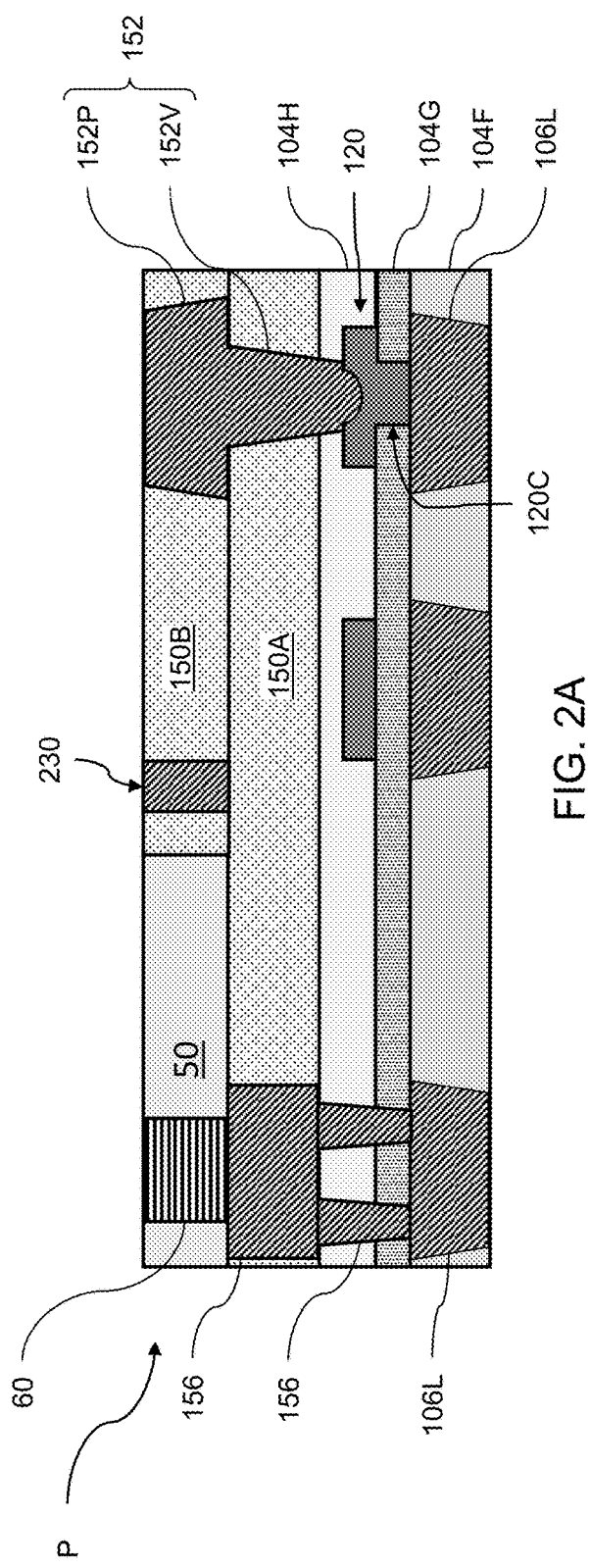
FIG. 2A is an enlarged view of a portion P1 of FIG. 1B, according to various embodiments of the present disclosure.
Figure 2B:
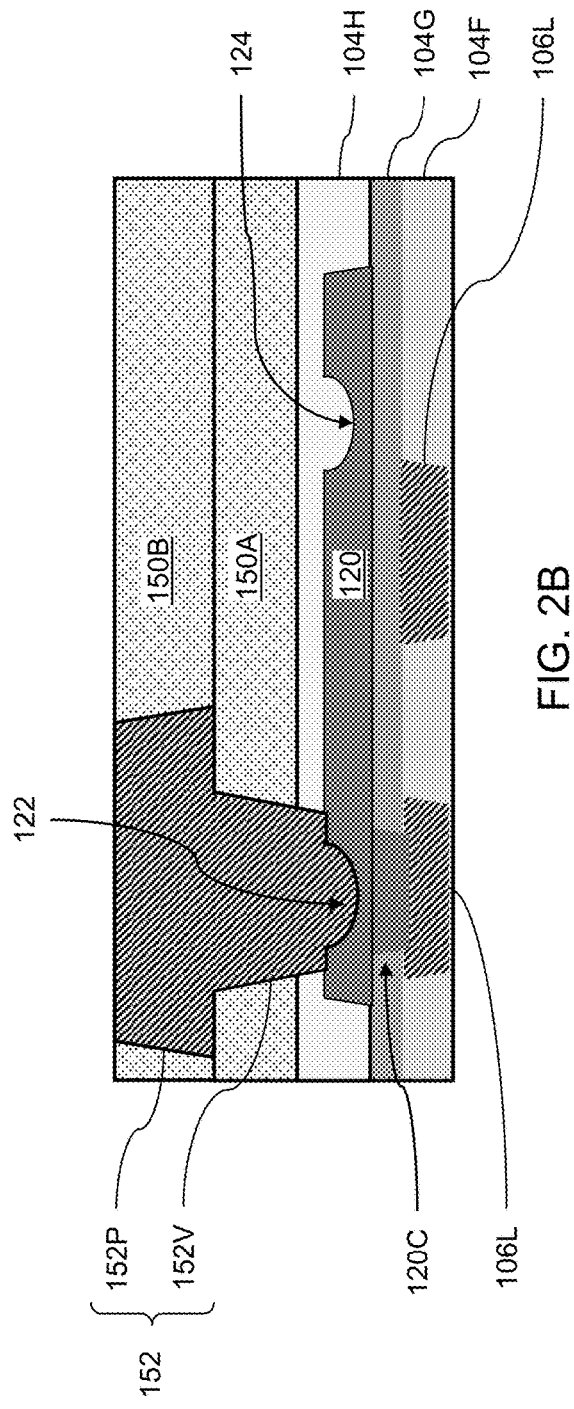
FIG. 2B is a cross-sectional view taken through a test pad of FIG. 2A, in a direction perpendicular to the cross-section of FIG. 2A.
Figure 2C:
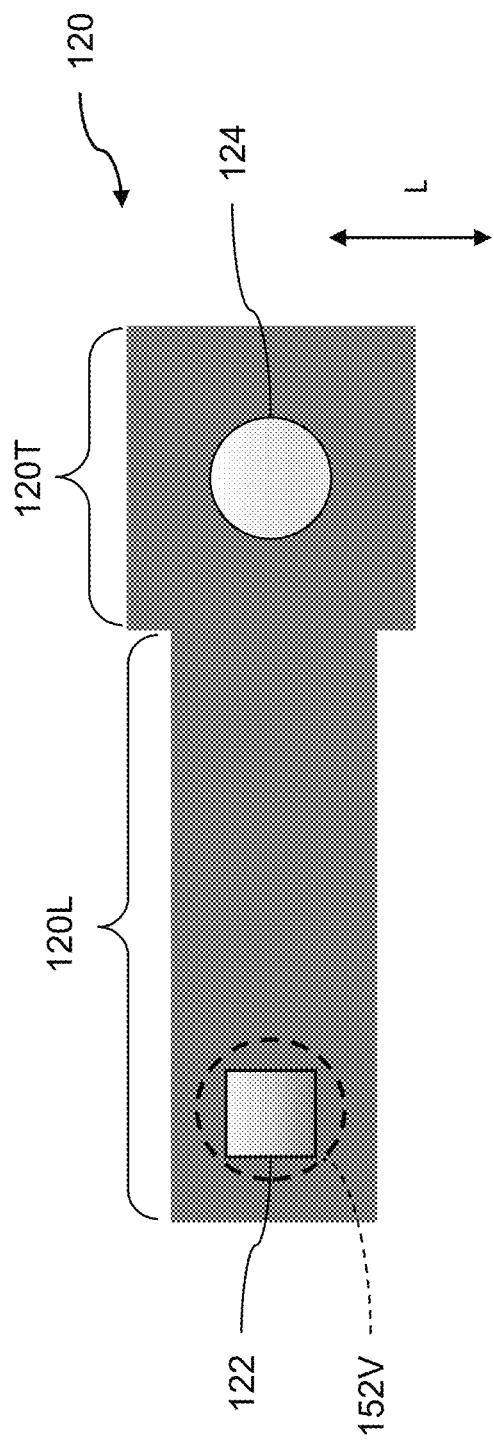
FIG. 2C is a top view of the test pad of FIG. 2B.

FIG. 2A is an enlarged view of a portion P1 of FIG. 1B, according to various embodiments of the present disclosure. FIG. 2B is a cross-sectional view taken through a test pad 120 of FIG. 2A, in a direction perpendicular to the cross-section of FIG. 2A. FIG. 2C is a top view of the test pad 120 of FIG. 2B.

Referring to FIGS. 2A-2C, the test pads 120 may be electrically connected to metal lines 106L in the uppermost ILD layer 104F. In various embodiments, the test pads 120 may be formed of a conductive test pad material, such as aluminum (Al), copper (Cu), silver (Ag), gold (Au), nickel (Ni), tungsten (W), alloys thereof, and/or multi-layers thereof. In some embodiments, the test pad 120 may be formed of aluminum, an aluminum-copper alloy, or multiple layers thereof.

The test pads 120 may include a landing region 120L, a test region 120T, and a contact region 120C. The test region 120T may be wider (in the L direction) than the landing region 120L to accommodate contact with a test probe. The landing region 120L may be longer than the test region 120T. The landing region 120L may be positioned at an edge of the first die 100, if necessary to establish contact with a test probe. For example, during manufacturing, the test region 120T may be exposed on the surface of the first die 100, such that a test probe may contact the test region 120T to test the electrical function of first die 100. The contact with the test probe may form a probe mark 124 in the test region 120T.

The contact region 120C may be disposed below the landing region 120L. The landing region 120L may include a bonding recess 122 disposed above the contact region 120C. The contact region 120C may be disposed in a trench formed in the passivation layer 104G and may contact an underlying metal line 106L, such that the test pad 120 is electrically connected to the interconnect structure 110 (see FIG. 1B).

The bonding recess 122 may be a concave structure, such as a depression, hole, or divot, formed in an upper surface of the test pad 120, and may be formed due to the formation of the contact region 120C below the landing region 120L. In some embodiments, the bonding recess 122 may have a curved surface.

The bonding pad structures 152 may include a least one bonding via structure 152V and a bonding pad 152P. The bonding via structure 152V may extend through at least the planarization layer 104H to contact the test pad 120. In some embodiment, the bonding via structure 152V may extend through both the first bonding layer 150A and the planarization layer 104H to contact the test pad 120.

As shown in FIG. 2C, the bonding recess 122 may be rectangular in the lateral direction L, and may correspond to the shape of the trench formed in the passivation layer 104G. However, the perimeter of the bonding recess 122 is not limited to any particular shape. For example, the perimeter of the bonding recess 122 and may be polygonal or ovoid, for example.

The bonding via structure 152V may be configured to overlap with at least a portion of the bonding recess 122, in a direction perpendicular to a stacking direction of the first die 100 and second die 200, such that the bonding via structure 152V directly contacts at least a portion of the bonding recess 122. For example, the bonding via structure 152V may vertically overlap with and/or directly contact 100% of the surface of the bonding recess 122. However, in other embodiments, the bonding via structure 152V may vertically overlap with and/or directly contact from 0.1% to 100%, such as from 25% to 100%, from 50% to 100%, or from 75% to 100% of the surface of the bonding recess 122.

Due to the curved surface of the bonding recess 122, the contact area between the test pad and the bonding pad structure 152 may be increased, as compared to if the bonding via structure 152V contacted a planar portion of the test pad 120. Accordingly, positioning the bonding pad structure 152 such that the bonding via structure 152V contacts at least a portion the bonding recess 122 may operate to reduce the contact resistance between the bonding pad structure 152 and the test pad 120, by increasing the contact area there between, without increasing the footprint of the pad via structure 152V on the surface of the test pad 120.

In addition, by overlapping the bonding via structure 152V with least a portion of the bonding recess 122, circuit resistance may be reduced, as compared to if the bonding via structure 152V contacted a planar portion of the test pad 120 further from the bonding recess 122. In particular, the test pad 120 may be formed of a material having a relatively high electrical resistance, such as aluminum, an aluminum alloy, or the like, and the bonding pad structure 152 and the metal line 106L may be formed of a material having a relatively low electrical resistance, such as copper, gold, silver, or the like.

As such, positioning the bonding via structure 152V over the bonding recess 122 reduces the minimum distance current may travel through the test pad 120, when flowing between the bonding via structure 152V and the metal line 106L. This in turn reduces overall circuit resistance, as compared to instances in which the bonding via structure 152V contacted a planar portion of the test pad 120 at a further distance from the bonding recess 122. Accordingly, the positioning of the bonding via structure 152V over at least a portion of the bonding recess 122, may result in both reduced contact resistance and reduced circuit resistance.

In addition, conventional package structures generally include bonding structures that directly connect the interconnect structures of adjacent dies, without utilizing test pads, in order to avoid an increase in circuit resistance and contact resistance thought arise from utilizing a test pad. For example, such bonding structures may include first and second bonding pads disposed in a bonding structure, and via structures that extend through both a planarization layer and a passivation layer to connect the bonding pads to metal features there below. As such, conventional package structures may require thicker bonding structures to accommodate two bonding pads.

In contrast, various embodiments of the present disclosure are configured to position the bonding pad structure 152, such that the test pad 120 may be utilized to electrically connect two dies, without experiencing a significant increase in circuit resistance and/or contact resistance. In addition, various embodiments allow for the omission of a second bonding pad, which allows for a reduction in the thickness of the die bonding structure 150, thereby unexpectedly improving space utilization.

Figure 3:
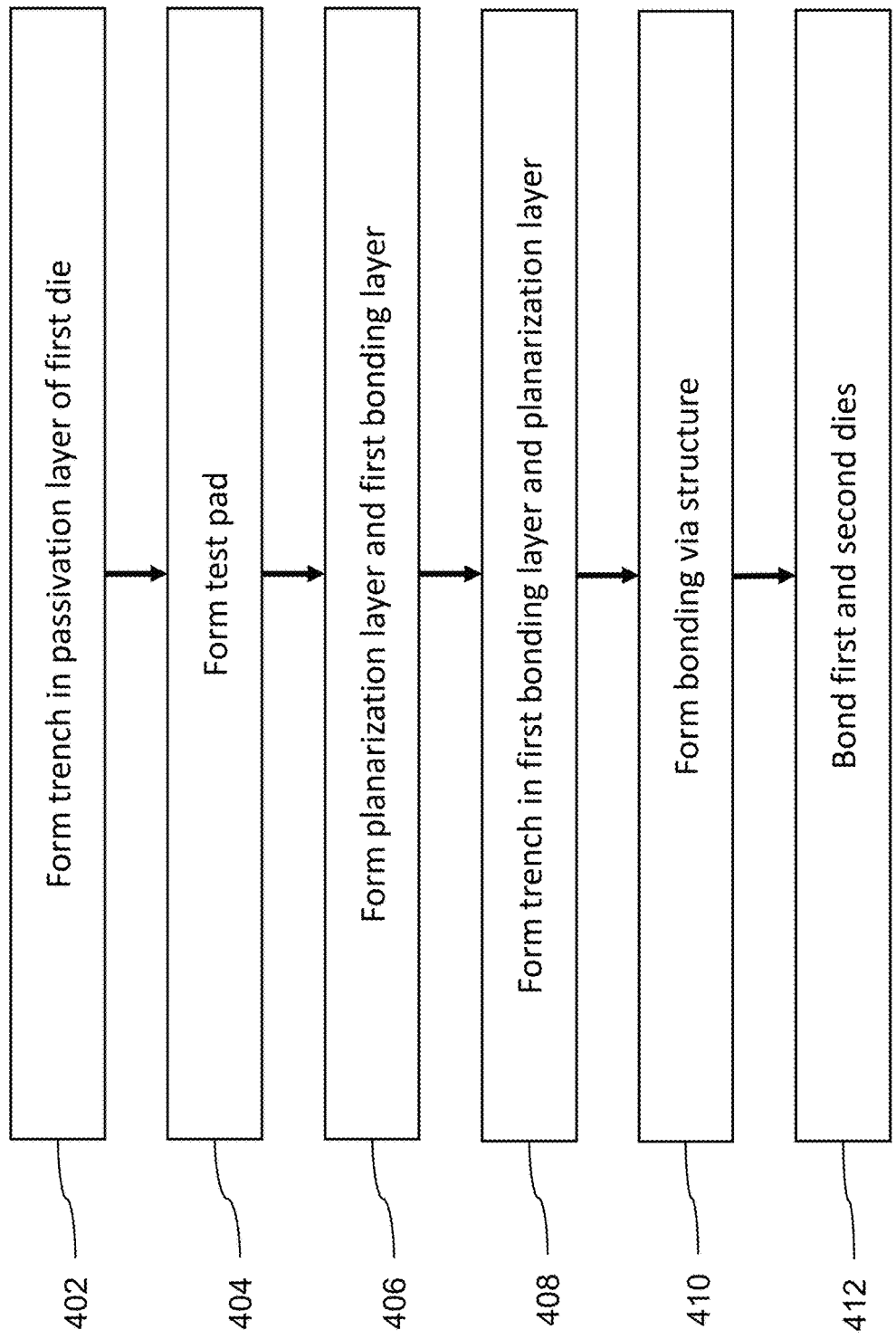
FIG. 3 is a flow chart showing a method of forming a test pad and bonding structure, according to various embodiments of the present disclosure.

FIG. 3 is a flow chart showing a method of forming a die bonding structure, according to various embodiments of the present disclosure. FIGS. 4A-4F are cross-sectional views illustrating the operations of the method of FIG. 3.

Referring to FIGS. 3 and 4A, in operation 402, the method may include forming a trench 112 (e.g., a first trench) in a passivation layer 104G of a first die 100. In particular, a photoresist layer PR1 may be formed on the passivation layer 104G. For example, a photoresist material may be deposited on the passivation layer 104G, exposed, and patterned to form the photoresist layer PR1. The photoresist layer PR1 may expose a portion of the passivation layer 104G. A wet or dry etching process may then be performed, using the photoresist layer PR1 as a mask, to form the trench 112 in the exposed portion of the passivation layer 104G. In some embodiments, the trench 112 may be vertically tapered, such that the bottom of the trench 112 may be wider than the top of the trench 112.

Referring to FIGS. 3, 4A, and 4B, in operation 404 the photoresist layer PR1 may be stripped, by ashing for example, and a test pad 120 may be formed on the passivation layer 104G and in the trench 112, by depositing a metal such as aluminum or an aluminum alloy. The test pad 120 may be formed using any suitable deposition process, such as an ALD process, an electroplating process, a laser lift off process, or the like. In particular, a contact region 120C of the test pad 120 may be formed in the trench 112, which may result in the formation of a bonding recess 122 above the contact region 120C. A remainder of the test pad 120 may be formed above the passivation layer 104G.

Figure 4C:
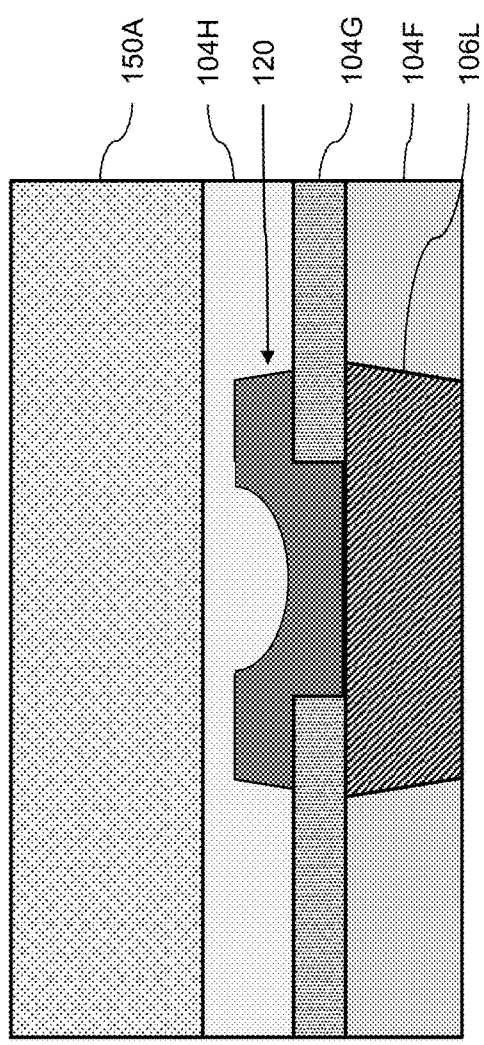

Referring to FIGS. 3 and 4C, in operation 406 a planarization layer 104H may be deposited on the test pad 120 and a first bonding layer 150A may be deposited on the planarization layer 104H, using any suitable deposition processes. In some embodiments, electrical die testing may be performed using the test pad 120, prior to forming the planarization layer 104H and the first bonding layer 150A.

Figure 4D:
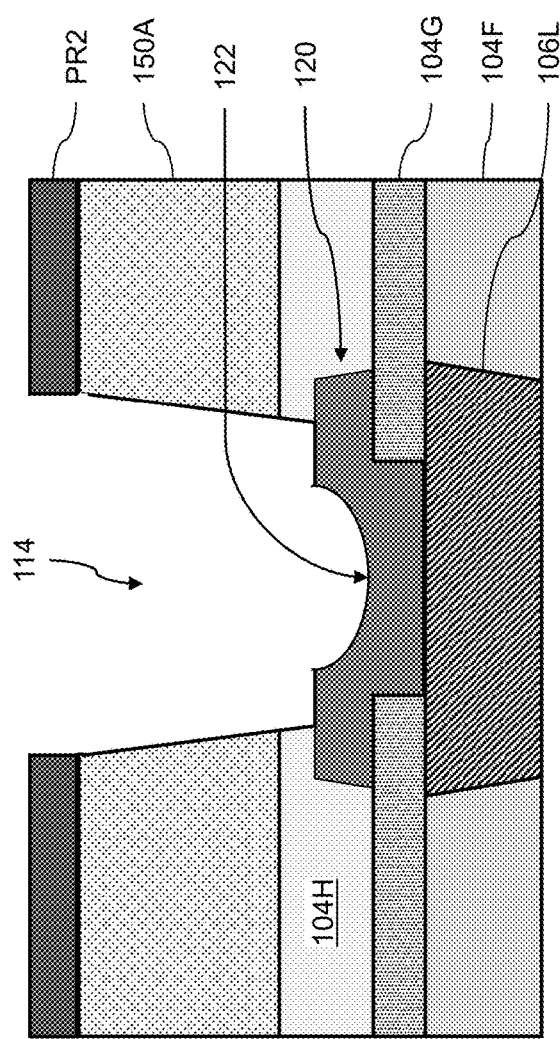

Referring to FIGS. 3 and 4D, in operation 408, a trench 114 (e.g., a second trench) may be formed in the first bonding layer 150A and the planarization layer 104H. In particular, a patterned photoresist PR2 may be formed on the first bonding layer 150A. The first bonding layer 150A and the planarization layer 104H may be etched through the photoresist layer PR2, using a wet or dry etching process, to form the trench 114. The trench 114 may expose a portion of the test pad 120. In particular, the trench 114 may expose at least a portion of the bonding recess 122.

Figure 4E:
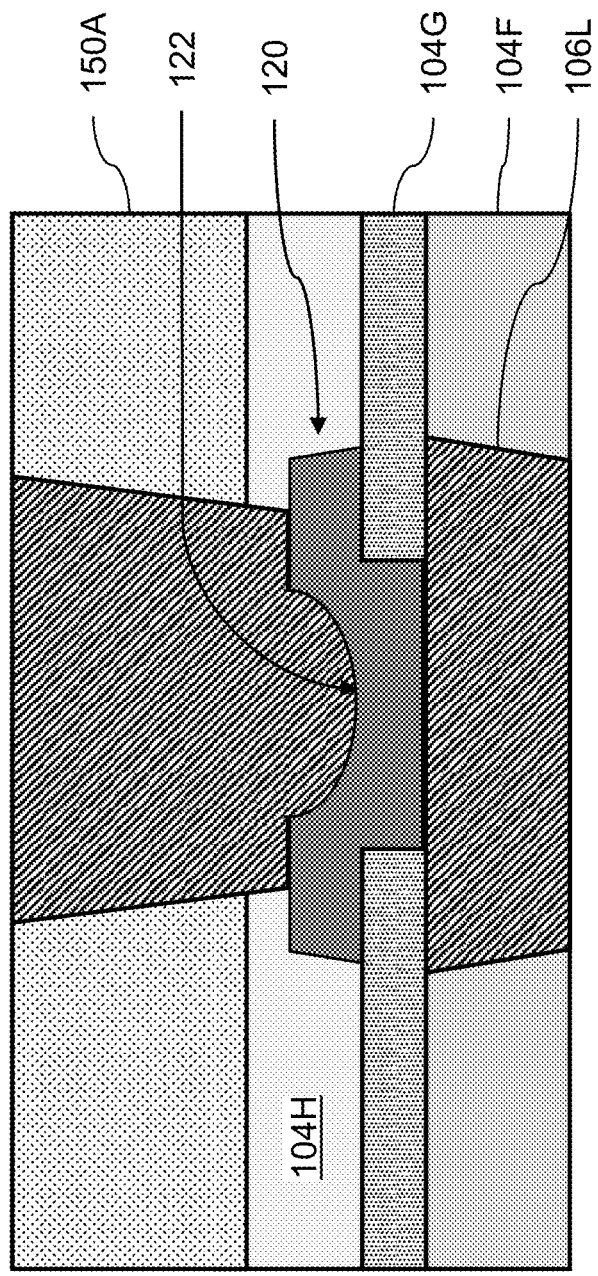

Referring to FIGS. 3 and 4E, in operation 410 a bonding via structure 152V may be formed in the trench 114, so as to at least partially cover the bonding recess 122. The bonding via structure 152V may be formed by depositing a conductive metal, such as copper, gold, silver, or the like, using any suitable process, such as a damascene process or the like.

Figure 4F:
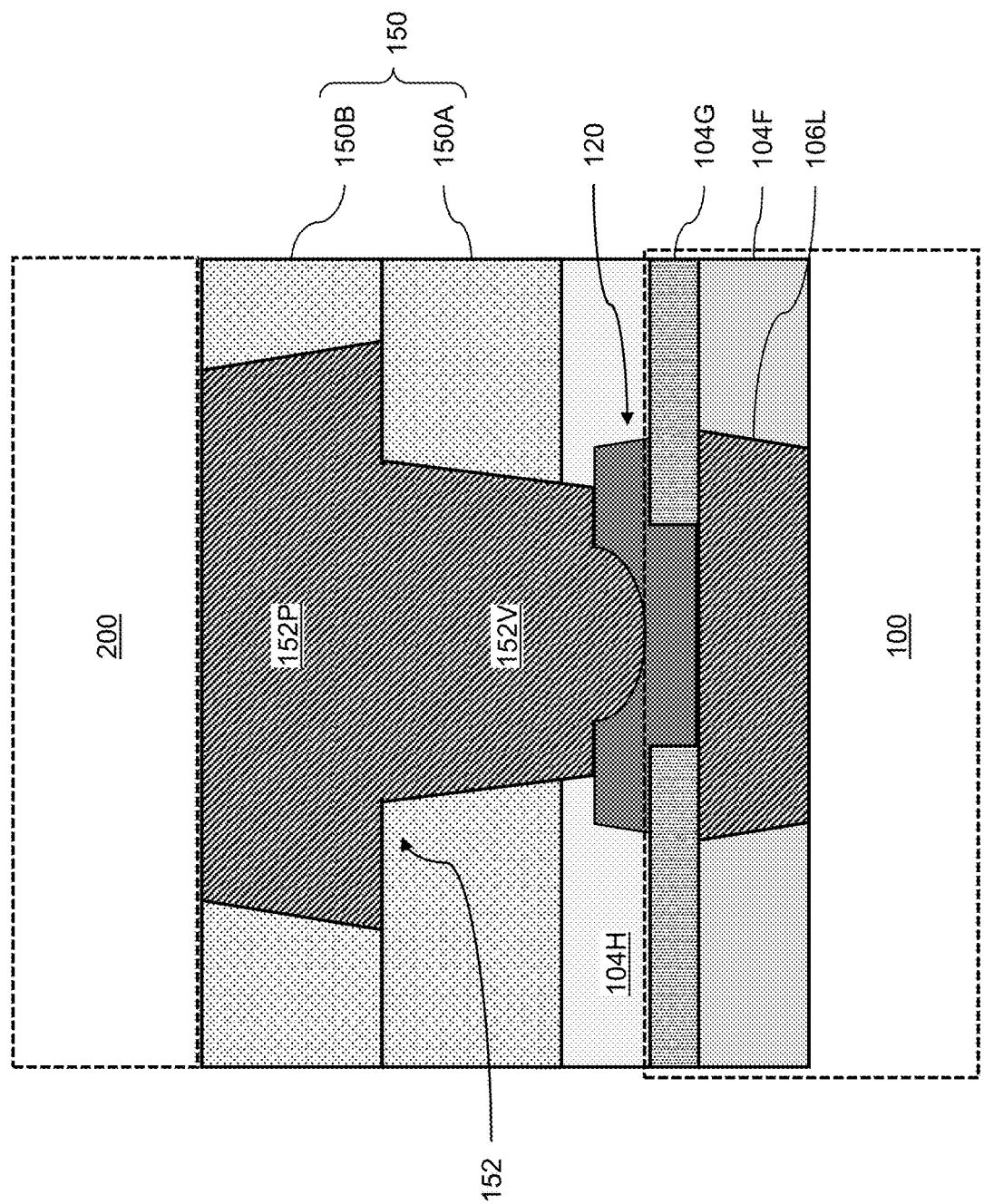

Referring to FIGS. 3 and 4F, in operation 412, a second die 200, including a bonding pad 152P and a second bonding layer 150B, may be bonded to the first die 100. In particular, the first die 100 and the second die 200 may be aligned, such that a bonding pad 152P is disposed on the bonding via structure 152V. Heat and/or pressure may be applied to bond the first bonding layer 150A with the second bonding layer 150B to form a die bonding structure 150, and to bond the bonding via structure 152V and the bonding pad 152P, to form a bonding pad structure 152. Any suitable bonding process may be used, such as a hybrid bonding process.

Figure 5A:
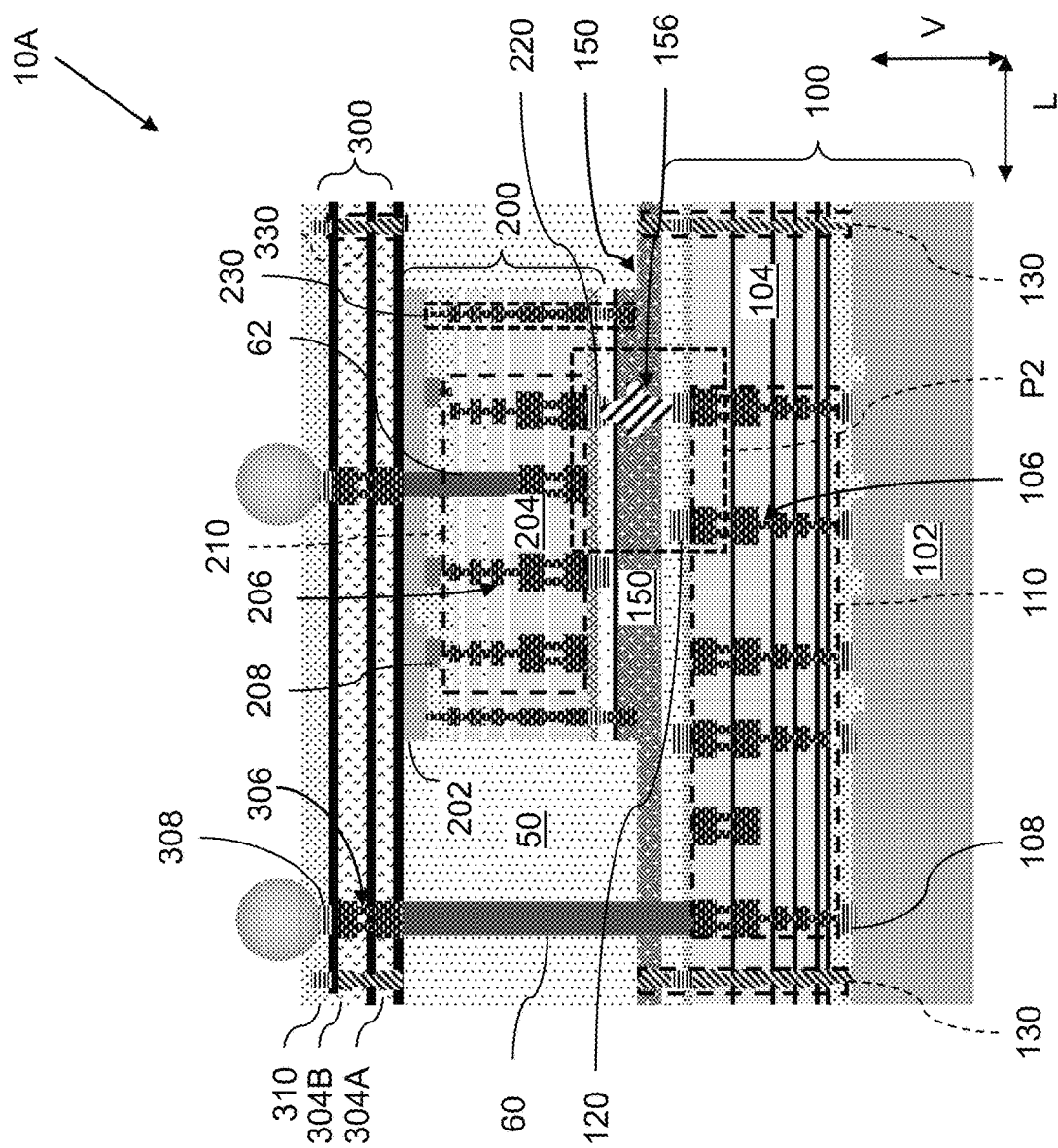
FIG. 5A is a cross-sectional view taken along line I-I' of FIG. 1A, an alternative semiconductor package structure 10A, according to various embodiments of the present disclosure.
Figure 5B:
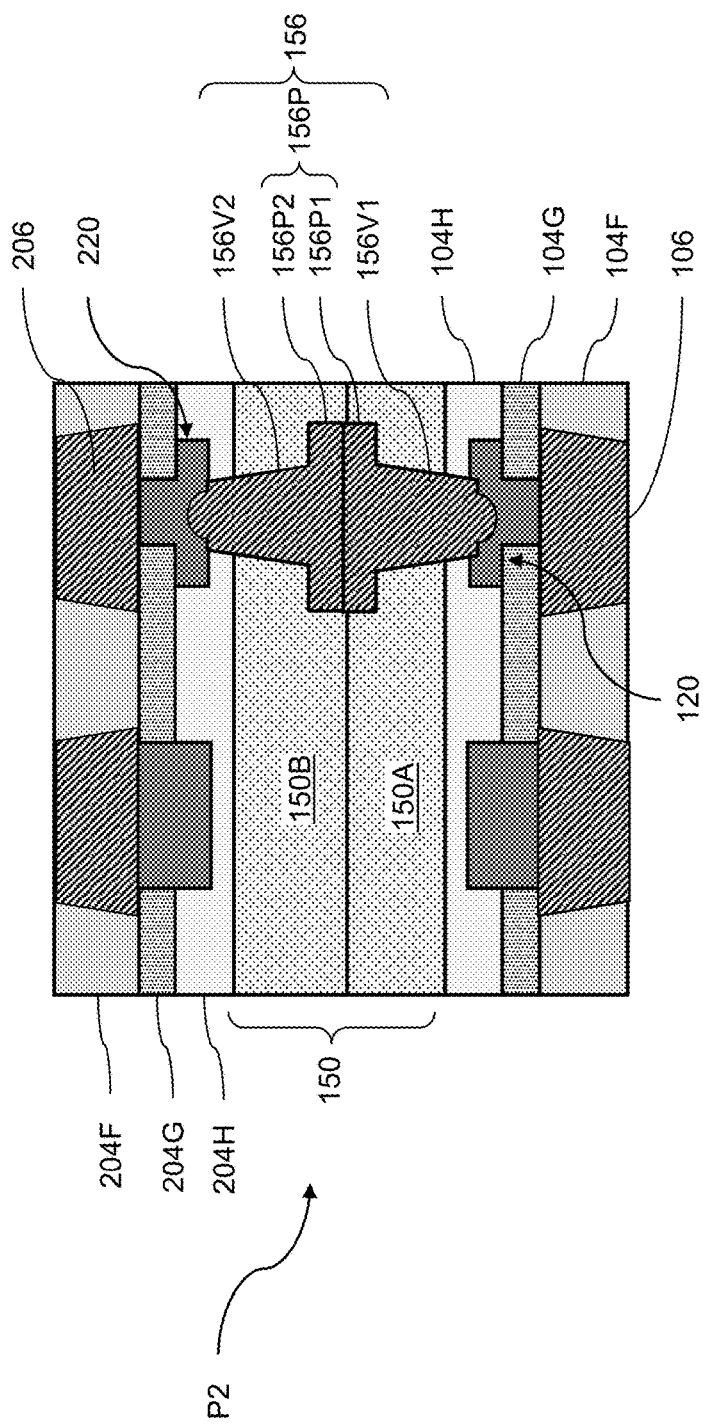
FIG. 5B is an enlarged view of a portion P2 of FIG. 5A.
Figure 5C:
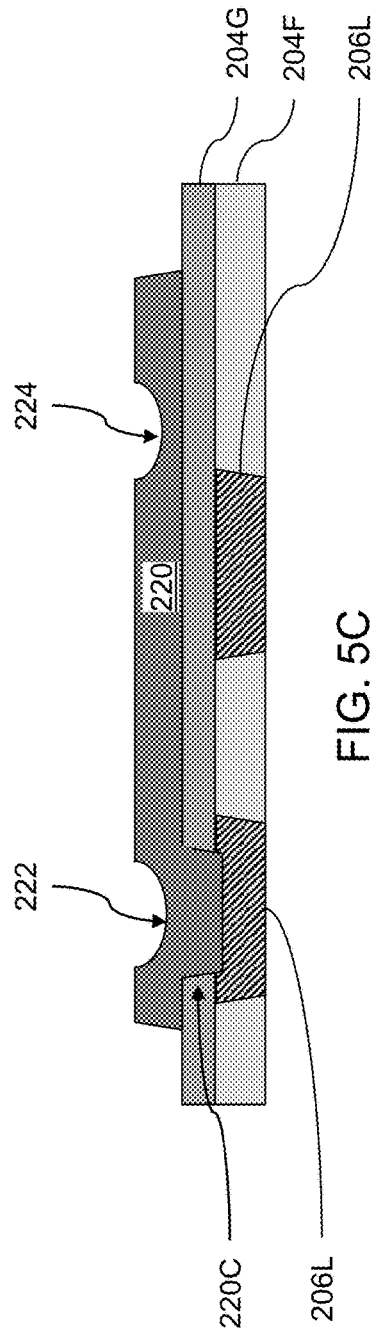
FIG. 5C is a cross-sectional view taken through a second test pad of FIG. 5B, in a direction perpendicular to the cross-section of FIG. 5B.
Figure 5D:
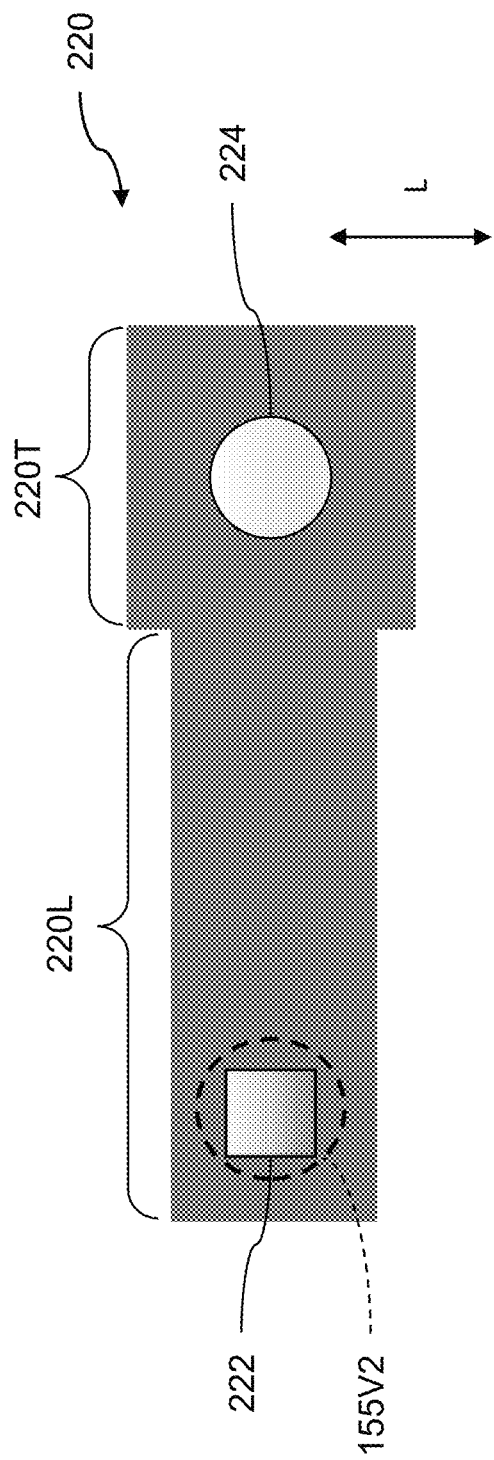
FIG. 5D is a top view of the second test pad of FIG. 5B.

FIG. 5A is a cross-sectional view taken along line I-I' of FIG. 1A, an alternative semiconductor package structure 10A, according to various embodiments of the present disclosure. FIG. 5B is an enlarged view of a portion P2 of FIG. 5A. FIG. 5C is a cross-sectional view taken through a second test pad 220 of FIG. 5B, in a direction perpendicular to the cross-section of FIG. 5B. FIG. 5D is a top view of the second test pad 220 of FIG. 5B. The semiconductor package structure 10A may be similar to the semiconductor package structure 10. As such, only the differences there between will be discussed in detail.

Referring to FIGS. 5A-5D, the semiconductor package structure 10A may include a first die 100 and a second die 200 stacked on one another and bonded by a die bonding structure 150 including a first bonding layer 150A and a second bonding layer 150B, and may be electrically connected by a bonding pad structure 156. The first die 200 may include a first test pad 120 that is similar to the test pad 120 shown in FIGS. 2B and 2C. In particular, the first test pad 120 extends through a first passivation layer 104G to contact one of the first metal features 106 and is covered by a first planarization layer 104H. The first test pad 120 may include a first landing region 120L, a first test region 120T, a first contact region 120C, a first bonding recess 122, and a first probe mark 124, as shown in FIGS. 2B and 2C.

The second die 200 may include a second test pad 220 that is similar to the first test pad 120. In particular, the second test pad extends through a second passivation layer 204G to contact a second metal feature 206, and that is covered by a second planarization layer 204H. The second test pad 220 may include a second landing region 220L, a second test region 220T, a second contact region 220C, a second bonding recess 222, and a second probe mark 224.

The bonding pad structure 156 may include a first bonding via structure 156V1, a second bonding via structure 156V2, and a bonding pad 156P (which may comprise the first bonding pad 156P1 and the second bonding pad 156P2). The first bonding via structure 156V1 may contact at least a portion of the first bonding recess. The second bonding via structure 156V2 may contact at least a portion of the second bonding recess 222. For example, the first bonding via structure 156V1 may vertically overlap with and/or directly contact 100% of the surface of the first bonding recess 122. However, in other embodiments, the first bonding via structure 156V1 may vertically overlap with and/or directly contact from 0.1% to 100%, such as from 25% to 100%, from 50% to 100%, or from 75% to 100% of the surface of the first bonding recess 122. The second bonding via structure 156V2 may vertically overlap with and/or directly contact 100% of the surface of the second bonding recess 222. However, in other embodiments, the second bonding via structure 152V2 may vertically overlap with and/or directly contact from 0.1% to 100%, such as from 25% to 100%, from 50% to 100%, or from 75% to 100% of the surface of the second bonding recess 222.

The bonding pad 156P may connect the first bonding via structure 156V1 and the second bonding via structure 156V2. The bonding pad 156P may be formed by bonding a first metal layer 156P1 formed in the first bonding layer 150A with a second metal layer 156P2 formed in the second bonding layer 150B, during bonding of the first die 100 and the second die 200.

Accordingly, the bonding pad structure 156 may electrically connect the first die 100 and the second die 200 using the first test pad 120 and the second test pad 220. Contact and circuit resistance may be reduced due to the direct contact between the first bonding via structure 156V1 and the first bonding recess 122, and between the second bonding via structure 156V1 and the second bonding recess 222. In addition, the configuration of the bonding pad structure 156 may allow for a reduction in the thickness of the die bonding structure 150.

Various embodiments provide a semiconductor package structure 10 that includes a first die 100, a second die 200 stacked on the first die 100, and a bonding pad structure 152. The first die 100 includes a first semiconductor substrate 102, a first interconnect structure 110 disposed on the first semiconductor substrate 102, a first passivation layer 104G disposed on the first interconnect structure 110, and a test pad 120 disposed on the first passivation layer 104G. The test pad 120 includes a contact region 120C that extends through the first passivation layer 104G and electrically contacts the first interconnect structure 110, and a bonding recess 122 that overlaps with the contact region 120C in a vertical direction perpendicular to a plane of the first semiconductor substrate 102. The bonding pad structure 152 electrically connects the first die 100 and the second die 200 and directly contacts at least a portion of the bonding recess 122.

In one embodiment, the bonding pad structure 152 may directly contact from 0.1% to 100% of the bonding recess.

In one embodiment, the bonding pad structure 152 may directly contact from 50% to 100% of the bonding recess.

In one embodiment, the bonding pad structure 152 may include: a bonding via structure 152V that may directly contact the bonding recess 122; and a bonding pad 152P that is disposed on the bonding via structure 152V and is electrically connected to the second die 200.

In one embodiment, a die bonding structure 152 may further include: a first bonding layer 150A that covers the first die 100; and a second bonding layer 150B that covers the second die 200 and is bonded to the first die 100.

In one embodiment, the bonding via structure 152V extends through the first bonding layer 150A and an interconnect planarization layer 104H; and the bonding pad 152P extends through the second bonding layer 150B and contacts a second interconnect structure 210 of the second die 200.

In one embodiment, the test pad 120 may include: a landing region 120L disposed on the first passivation layer 104G, over the contact region 120C, the landing region 120L comprising the bonding recess 122; and a test region 120T disposed on the first passivation layer 104G and extending from the landing region 120L.

In one embodiment, the test region 120T may be wider than the landing region 120L and may be configured to contact a test probe. In one embodiment, the test pad 120 may be formed of a material having a higher electrical resistance than a material used to form the bonding pad structure. In one embodiment, the test pad includes aluminum or an aluminum alloy; and the bonding pad structure 152 comprises copper, gold, silver, or a combination thereof.

In one embodiment, the bonding recess 122 has a concave surface and is configured to decrease electrical contact resistance between the test pad 120 and the bonding pad structure 152. In one embodiment, the first die 100 and the second die 200 may be face-to-face bonded.

Various embodiments of the present disclosure provide a semiconductor package structure 10A that includes a first die 100, a second die 200 stacked on the first die 100, and a bonding pad structure 156. The first die 100 includes a semiconductor substrate 102, a first interconnect structure 110 disposed on the first semiconductor substrate 102, a first passivation layer 104G disposed on the first interconnect structure 110, and a first test pad 120 disposed on the first passivation layer 104G. The second die 200 includes a second semiconductor substrate 202; a second interconnect structure 210 disposed on the second semiconductor substrate 202; a second passivation layer 204G disposed on the second interconnect structure; and a second test pad 220 disposed on the second passivation layer 204G.

The first test pad 120 comprises a first contact region 120C that extends through the first passivation layer 104G and electrically contacts the first interconnect structure 110, and a first bonding recess 122 that overlaps with the first contact region 120C in a vertical direction perpendicular to a plane of the first semiconductor substrate 102. The second test pad 220 comprises a second contact region 220C that extends through the second passivation layer 204G and electrically contacts the second interconnect structure 210, and a second bonding recess 222 that overlaps with the contact region 220C in the vertical direction.

The bonding pad structure 156 that electrically connects the first die 100 and the second die 200 and directly contacts least a portion of the first bonding recess 122 and at least a portion of the second bonding recess 222.

In one embodiment, the bonding pad structure 156 may directly contact from 0.1% to 100% of the surface of the first bonding recess 122 and may directly contact from 0.1% to 100% of the surface of the second bonding recess 222.

In one embodiment, the bonding pad structure 156 may include: a first bonding via structure 156V1 that may directly contact the first bonding recess 122; a second bonding via structure 156V2 that may directly contact the second bonding recess 222; and a bonding pad 156P1/156P2 that may connect the first bonding via structure 156V1 and the second bonding via structure 156V2.

In one embodiment, a die bonding structure 150 may include a first bonding layer 150A bonded to the first die 100 and a second bonding layer 150B bonded to the second die 200 and the first bonding layer 150A, wherein the bonding pad 156P1/156P2 may also include: a first metal layer 156P1 formed in the first bonding layer 150A and bonded to the first bonding via structure 156V1; and a second metal layer 156P2 formed in the second bonding layer 150B and bonded to the second bonding via structure 156V2 and the first metal layer 156P1.

In one embodiment, the first die 100 and the second die 200 may be face-to-face bonded; and the first test pad 120 and the second test pad 220 may be formed of a material having a higher electrical resistance than a material used to form the bonding pad structure 156.

Various embodiments of the present disclosure provide a method of forming a semiconductor package 10, comprising: forming a first trench 112 in a first passivation layer 104G of a first die 100 to expose a first interconnect structure 110 of the first die; forming a first test pad 120 on the first passivation layer 104G and in the first trench 112, such that the first test pad 120 comprises a first bonding recess 122 disposed above the first trench 112; forming a first planarization layer 104H on the first test pad 120 and forming a first bonding layer 150A on the first planarization layer 104H, forming a second trench 114 in the first bonding layer 150A and the first planarization 104H layer to expose the first bonding recess 122; forming a bonding via structure 152V in the second trench 114, such that the bonding via structure 152V directly contacts at least a portion of the first bonding recess 122; and bonding a second die 200 to the first die 100, such that a second bonding layer 150B of the second die 200 is bonded to the first bonding layer 150A and a bonding pad 152P of the second die 200 is bonded to the bonding via structure 152V to form a bonding pad structure 152 that electrically connects the first die 100 and the second die 200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a first die comprising:
      a first semiconductor substrate;
      a first interconnect structure disposed on the first semiconductor substrate;
      a first passivation layer disposed on the first interconnect structure; and
      a test pad disposed on the first passivation layer, the test pad comprising a contact region that extends through the first passivation layer and electrically contacts the first interconnect structure, and a bonding recess that overlaps with the contact region in a vertical direction perpendicular to a plane of the first semiconductor substrate;
   a second die stacked on the first die in the vertical direction; and
   a bonding pad structure electrically connecting the first die and the second die and directly contacting at least a portion of the bonding recess.

2. The semiconductor package of claim 1, wherein the bonding pad structure directly contacts from 0.1% to 100% of the bonding recess.

3. The semiconductor package of claim 1, wherein the bonding pad structure directly contacts from 50% to 100% of the bonding recess.

4. The semiconductor package of claim 1, wherein the bonding pad structure comprises:
   a bonding via structure that directly contacts the bonding recess; and
   a bonding pad that is disposed on the bonding via structure and is electrically connected to the second die.

5. The semiconductor package of claim 4, further comprising a die bonding structure comprising:
   a first bonding layer that covers the first die; and
   a second bonding layer that covers the second die and is bonded to the first die.

6. The semiconductor package of claim 5, wherein:
   the bonding via structure extends through the first bonding layer and an interconnect planarization layer; and
   the bonding pad extends through the second bonding layer and contacts a second interconnect structure of the second die.

7. The semiconductor package of claim 1, wherein the test pad comprises:
   a landing region disposed on the first passivation layer, over the contact region, the landing region comprising the bonding recess; and
   a test region disposed on the first passivation layer and extending from the landing region.

8. The semiconductor package of claim 7, wherein the test region is wider than the landing region and is configured to contact a test probe.

9. The semiconductor package of claim 1, wherein the test pad is formed of a material having a higher electrical resistance than a material used to form the bonding pad structure.

10. The semiconductor package of claim 1, wherein:
   the test pad comprises aluminum or an aluminum alloy; and
   the bonding pad structure comprises copper, gold, silver, or a combination thereof.

11. The semiconductor package of claim 1, wherein the bonding recess has a concave surface and is configured to decrease electrical contact resistance between the test pad and the bonding pad structure.

12. The semiconductor package of claim 1, wherein the first die and the second die are face-to-face bonded.

13. A semiconductor package comprising:
a first die comprising:
 a first semiconductor substrate;
 a first interconnect structure disposed on the first semiconductor substrate;
 a first passivation layer disposed on the first interconnect structure; and
 a first test pad disposed on the first passivation layer, the first test pad comprising a first contact region that extends through the first passivation layer and electrically contacts the first interconnect structure, and a first bonding recess that overlaps with the first contact region in a vertical direction perpendicular to a plane of the first semiconductor substrate;
a second die stacked on the first die in the vertical direction and comprising:
 a second semiconductor substrate;
 a second interconnect structure disposed on the second semiconductor substrate;
 a second passivation layer disposed on the second interconnect structure; and
 a second test pad disposed on the second passivation layer, the second test pad comprising a second contact region that extends through the second passivation layer and electrically contacts the second interconnect structure, and a second bonding recess that overlaps with the second contact region in the vertical direction; and
a bonding pad structure that electrically connects the first die and the second die and directly contacts least a portion of the first bonding recess and at least a portion of the second bonding recess.

14. The semiconductor package of claim 13, wherein the bonding pad structure directly contacts from 0.1% to 100% of a surface of the first bonding recess and directly contacts from 0.1% to 100% of a surface of the second bonding recess.

15. The semiconductor package of claim 13, wherein the bonding pad structure comprises:
 a first bonding via structure that directly contacts the first bonding recess;
 a second bonding via structure that directly contacts the second bonding recess; and
 a bonding pad that connects the first bonding via structure and the second bonding via structure.

16. The semiconductor package of claim 15, further comprising a die bonding structure comprising a first bonding layer bonded to the first die and a second bonding layer bonded to the second die and the first bonding layer,
wherein the bonding pad comprises:
 a first metal layer formed in the first bonding layer and bonded to the first bonding via structure; and
 a second metal layer formed in the second bonding layer and bonded to the second bonding via structure and the first metal layer.

17. The semiconductor package of claim 13, wherein:
the first die and the second die are face-to-face bonded; and
the first test pad and the second test pad are formed of a material having a higher electrical resistance than a material used to form the bonding pad structure.

18. A method of forming a semiconductor package, comprising:
 forming a first trench in a first passivation layer of a first die to expose a first interconnect structure of the first die;
 forming a first test pad on the first passivation layer and in the first trench, such that the first test pad comprises a first bonding recess disposed above the first trench;
 forming a first planarization layer on the first test pad and forming a first bonding layer on the first planarization layer;
 forming a second trench in the first bonding layer and the first planarization layer to expose the first bonding recess;
 forming a bonding via structure in the second trench, such that the bonding via structure directly contacts at least a portion of the first bonding recess; and
 bonding a second die to the first die, such that a second bonding layer disposed on the second die is bonded to the first bonding layer and a bonding pad of the second die is bonded to the bonding via structure to form a bonding pad structure that electrically connects the first die and the second die.

19. The method of claim 18, wherein the bonding via structure directly contacts from 0.1% to 100% of the first bonding recess.

20. The method of claim 18, wherein:
bonding the first die to the second die comprises face-to-face bonding; and
forming the first test pad comprises forming the first test pad of a material having a higher electrical resistance than a material used to form the bonding pad structure.

* * * * *